United States Patent [19]

Engel et al.

[11] 3,988,955

[45] Nov. 2, 1976

[54] COATED STEEL PRODUCT AND PROCESS OF PRODUCING THE SAME

[76] Inventors: Niels N. Engel, 720 Gonzales Road, Santa Fe, N. Mex. 87501; Eugene A. Anderson, 1594 Evans Drive S.W., Atlanta, Ga. 30310

[22] Filed: Sept. 11, 1974

[21] Appl. No.: 505,148

Related U.S. Application Data

[63] Continuation-in-part of Ser. No. 424,672, Dec. 14, 1972, Pat. No. 3,925,116, which is a continuation-in-part of Ser. No. 279,244, Aug. 9, 1972, Pat. No. 3,915,757.

[52] U.S. Cl. .............................. 83/661; 204/173; 30/350; 76/112; 76/DIG. 2; 76/DIG. 11; 83/835; 427/46; 427/38; 427/376 E; 428/472; 148/6.35; 148/31.5; 148/39; 148/147

[51] Int. Cl.$^2$ ...................... C21D 1/10; C21D 9/24; C23C 11/12

[58] Field of Search ............. 117/93, 93.3, 93.1 GD, 117/93.2; 427/38, 46, 376; 30/380, 346, 350, 355, 357; 76/112, DIG. 2, DIG. 11; 83/661, 835; 428/472

[56] References Cited
UNITED STATES PATENTS

| | | |
|---|---|---|
| 2,422,561 | 6/1947 | Pauit.................................... 30/350 |
| 3,003,370 | 10/1961 | Coulter............................ 76/DIG. 2 |
| 3,449,146 | 6/1969 | Dawson ............................ 117/93.2 |
| 3,832,219 | 8/1974 | Nelson et al....................... 117/93.3 |

OTHER PUBLICATIONS

Guy, *Elements of Physical Metallurgy*, 2nd Ed., Addison–Wesley Pub. Co., Inc., Reading, Mass., pp. 466, 473, 474.

*Primary Examiner*—John H. Newsome

[57] ABSTRACT

A coated steel product, namely, a cutting instrument such as a band saw blade, in which the body of the blade is of steel, the tooth tip is of impulse hardened steel and the tip is covered with a coating of titanium carbide or refractory metal carbide, the coating metal or compound having been deposited by ion plating onto the surface of the tip. The process through which the cutting tool is produced includes preshaping and sharpening the tool, then ion cleaning the tips, bombarding the tips with ions of the titanium or refractory metal followed by reacting the titanium or refractory metal with a carbon containing chemical or their carbides and then simultaneously subjecting both the coating and the steel tip to a magnetic flux for impulse hardening primarily the steel tip. Other coatings of metal carbides, nitrides, borides and metal compounds are described.

13 Claims, 5 Drawing Figures

COATED STEEL PRODUCT AND PROCESS OF PRODUCING THE SAME

CROSS REFERENCE TO RELATED APPLICATIONS

This application relates to and is a continuation-in-part of copending application, Ser. No. 424,672, filed Dec. 14, 1972, entitled "Superhard Martensite and Method of Making Same" now U.S. Pat. No. 3,925,116; which was a continuation-in-part of copending application, Ser. No. 279,244, filed Aug. 9, 1972, entitled "Ion Plating Method and Product Therefrom" now U.S. Pat. No. 3,915,757.

BACKGROUND OF THE INVENTION

1. Field of the Invention

This invention relates to a coated steel product, and a process of producing the same.

2. Description of the Prior Art

The Applicant is aware of the following U.S. prior art patents:

| | |
|---|---|
| 706,701 Thurston | 3,336,169 Kihlberg, et al. |
| 706,702 Thurston | 3,336,903 Point |
| 2,618,572 Parrish | 3,341,352 Ehlers |
| 2,685,535 Nack | 3,376,156 Whitaker, et al. |
| 2,698,812 Schladitz | 3,382,085 Wren, et al. |
| 2,714,563 Poorman, et al. | 3,404,084 Hamilton |
| 2,719,820 Allen | 3,426,730 Lawson, et al. |
| 2,754,225 Gfeller | 3,472,751 King |
| 2,799,760 Foungel | 3,485,654 McGraw, et al. |
| 2,875,112 Becker | 3,501,334 Flaherty |
| 2,916,409 Bucek | 3,503,775 Austin |
| 2,921,877 Samuel, et al. | 3,513,810 Jackson |
| 2,939,943 Walter | 3,514,388 Brumfield, et al. |
| 3,010,009 Ducati | 3,562,002 Smith, Jr. |
| 3,019,126 Bartholomew | 3,573,090 Peterson |
| 3,046,936 Simons, Jr. | 3,573,098 Bieber, et al. |
| 3,048,498 Juvinall, et al. | 3,575,138 Austin |
| 3,116,180 Malzacher | 3,117,022 Bronson |
| 3,131,097 Mantel | 3,133,874 Morris |

Applicant is also aware of the prior art German Pat. No. 1,957,884.

In the past band saw blades and other cutting or wear resistant instruments or tools have been manufactured from a martensitic steel in which the metal has been heat treated to impart a hard cutting edge. This treatment has usually been confined to the cutting edge or edges. Also, cutting edges have been coated with tungsten carbide, titanium carbide or other hard materials, in order to harden the tips to increase their useful life. However, no cutting instrument has been produced wherein the refractory metal or compound has been ion implanted into a steel surface of the cutting edge, then coverted to a harder compound on the edge and both the refractory metal compound and the steel tip have been impulse hardened. This provides a corrosive resistant blade with a useful life many times as long as a plain hardened blade.

BRIEF DESCRIPTION OF THE INVENTION

Briefly described, the present invention in its broadest aspects includes a ferrous metal instrument having a refractory metal compound as a coating on a portion thereof, the compound being imbedded into the surface and held in place by a martensitic structure formed by the simultaneous impulse treatment of both the coating and the substrate adjacent thereto.

The more specific form of the invention is a cutting instrument, namely, a saw blade particularly useful as a band saw blade. The blade has successive teeth, the tips of which form substrates provided with coatings of ion plated metal compound thereon and imbedded therein. The tip substrates are in the form of sub-microscopic martensite firmly holding the implanted refractory metal compound.

The process of producing the product includes, first, shaping and sharpening the instrument or tool into its final configuration. For the band saw blade, it includes cutting the teeth along an edge of a steel strip of uniform width and then deforming and sharpening these teeth. A length of the blade is then cleaned and tightly coiled and placed in an ion implanting chamber so that the tips of the teeth are all exposed to the atmosphere of the chamber. The coil is electrically connected in a d.c. electrical circuit to form the cathode while the vaporating refractory metal forms the anode. After several flushings of the chamber with argon or other inert gas and drawing a vacuum therein, a plasma is created by the circuit to clean the surface of the cutting edges. Thereafter, the refractory metal is heated to melting. This ion implants the refractory metal onto the tips which thus form the substrate.

If a refractory metal is used, it is then converted to a carbide, nitride, boride or metal compound through reacting it with an appropriate chemical in the ion plating chamber or by a special treatment outside the chamber.

The final step includes impulse hardening of only the coated cutting edge. By such a procedure, a resulting cutting instrument is provided which has a superior useful life and is corrosion resistant.

After impulse hardening, the saws are cut to length and the ends welded together.

The band saw illustrated herein is a meat and bone cutting band saw, in which the tip of each tooth of the martensitic saw blade is bombarded with titanium. The titanium is then converted to titanium carbide and the coated tips are progressively passed through the coil of an impulse hardening machine. Each tip, therefore, includes a hardened martensite base having sub-microscopic crystals and being coated with a hardened titanium carbide coat. The body of the blade is martensite which has not received the impulse heat treating.

Accordingly, it is an object of the present invention to provide a coated steel product which is inexpensive to manufacture and has superior wear resistant and corrosive resistant qualities.

Another object of the present invention is to provide a cutting instrument which has a long useful life.

Another object of the present invention is to provide a cutting instrument which is inexpensive to manufacture, durable in structure and efficient in operation.

Another object of the present invention is to provide a superior band saw blade and an efficient method of manufacturing the blade.

Other objects, features and advantages of the present invention will become apparent from the following description when taken in conjunction with the accompanying drawings wherein like characters of reference designate corresponding parts.

DETAILED DESCRIPTION

Figure 1:
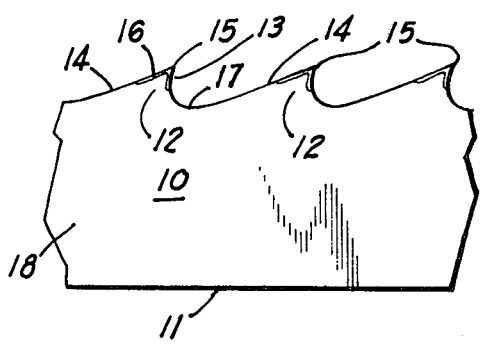
FIG. 1 is a side elevational view of a portion of a band saw blade which illustrates a form of cutting instrument made in accordance with the teachings of the present invention.
Figure 2:
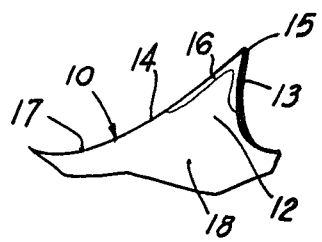
FIG. 2 is a an enlarged fragmentary side elevational view showing one tooth of the blade depicted in FIG. 1.

In more detail, the cutting instrument or tool is illustrated as a band saw blade 10 which is of uniform width throughout its length, the tooth 12 of the band saw blade 10 being seen best in FIGS. 1 and 2. The contour configuration of the blade 10 is conventional and includes a straight rear edge 11 and a plurality of successive, equally spaced teeth 12 along its front edge.

Each tooth 12 has a leading or cutting edge 13 and a trailing edge 14 tapering outwardly to a tip 15. Alternate teeth 12 are offset laterally in opposite directions. The leading edge or cutting edge 13 is sharpened in the usual way.

The blade 10 is formed from a coil of 1095 AISI steel (0.95% to 1.05% carbon) which has a hardness of about 70 on the Rockwell 30 N scale (equivalent to about 50 on the Rockwell C scale).

Each tooth 12 has a coating 16 covering its tip portion, and being formed of a hard metal, as for example, a refractory metal compound such as tungsten carbide or titanium carbide. The coating 16 is about 0.001 inch in thickness and covers about one cubic millimeter in an L shape along the tip area of blade 10, extending from about 0.060 inch to about 0.070 inch from the tip 15 inwardly along cutting edge 13. The coating 16 extends from about 0.070 inch to about 0.50 inch along trailing edge 14.

In production, a coil of steel is stamped to provide the successive teeth 12. The teeth 12 are then progressively bent out of the plane of the flat body 18, each tooth 12 being bent laterally in a direction opposite its adjacent tooth 12. The cutting edges 13 of the teeth 12 are then sharpened.

Figure 3:
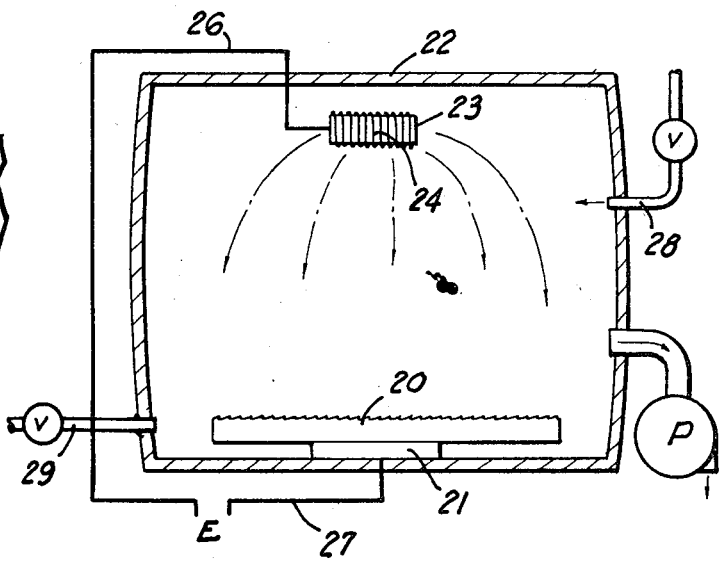
FIG. 3 is a schematic view of an ion plating vacuum chamber depicting a coiled length of band saw blade being ion plated with the coating metal of the present invention.

According to the present invention, a length of saw blade 10, thus formed, which is usually about 500 to 600 feet, is coiled to provide the blade coil 20, seen in FIG. 3. The coil 20 is preliminarily cleaned in the normal manner and then placed teeth up on a cathode plate 21 in a vacuum chamber 22. The coil is firmly electrically grounded to plate 21. The chamber 22 is provided with a tungsten anode filament 23 above the plate 21 and around filament 23 is wrapped the plating material, namely, a length of tungsten wire or titanium wire 24.

Electrical conductors 26 and 27 connect the anode filament 23 and cathode plate 21 to a d.c. potential E. A vacuum pump P is provided to evacuate the chamber 22 and gas lines 28 and 29 are for selectively introducing the inert flushing gas (argon) and the carbonizing gas (methane) into the chamber 22. Each line has a control valve V.

The chamber 22 is then pumped down to a vacuum of $2 \times 10^{-5}$ Torr or better with frequent flushings or argon gas. Such a low pressure is necessary to remove absorbed gasses released therein. Next, the argon gas is introduced into the chamber to a plasma bearing pressure around $10^{-2}$ Torr. A d.c. electrical potential is then applied between the anode filament 23 and the cathode plate 21, and is gradually increased until a pink argon plasma is formed. Argon is used in the chamber 22 since it will tend to harden martensite and is heavy so as to increase the impact force of the ions on the cathode whereby better cleaning action is achieved. The plasma starts forming in the range of 1KV and 50 milliamps and can then be maintained by a much lower potential. The potential setting can be varied according to the needs; generally 2 – 3 KV.

The coil 20 to be ion plated is first ion cleaned with the argon plasma. The argon sputters off any atomic impurities or dirt that are present on the exposed surfaces, namely, the teeth 12. Some argon penetrates into the steel and causes the formation of the superfine martensite formed as the subsequent impulse hardening.

The ion plating material on a filament (such as a wire 24) or from a pool of melted metal heated by an electron gun forms the anode within the chamber. By passing sufficient current through the filament 23 while the argon plasma is holding, the filament 23 and wire 24 are gradually heated until the wire 24 on the anode melts and, aided by the substantial vacuum within the chamber, then vaporizes and is ionized. These ionized particles are attracted to the coil 20 on cathode plate 23 due to the great potential difference (which can vary from 500V to 50,000V), and thus, ion implantation and/or plating is accomplished.

Actually, the first ions that strike the surface of coil 20 are implanted within the teeth 12 and cause a gradual transition between the metal of teeth 12 and the surface. As the plated area becomes "saturated" by the ion implantation, the remainder of the ions are deposited on the surface of teeth 12 over the imbedded ions. The penetration depth of the ion implantation into the substrate depends on the hardness of the substrate.

When the implanted metal ions such as titanium or vanadium ions react with the carbon present in the steel blade substrate, it is not known at this time whether they form a precipitate or are in "solution" within the crystalline lattice of the substrate. This is due to the fact that compounds formed by the implanted ions are too small to be observed by present day methods.

The time duration of ion plating can be varied from fractions of seconds to several minutes. During the ion plating process, the vacuum in the chamber does decrease somewhat, but should be maintained at the right level by adjusting the argon pressure or metal vaporization.

The above ion plating procedure can be performed on a number of steel or ferrous containing alloys, such as razor blades, industrial blades, band saws, files, nails, etc., as well as other metals and shapes including meat chopper plates. Martensitic steels, 1060–1095 AISI, are recommended. This martensitic steel is used for the body of the saw blade 10.

While it appears that titanium or tungsten provides the most practical plating metal, a wide range of elements can be ion plated onto the substrate, if desired. These include all of the refractory elements (scandium, titanium, yttrium, zirconium, hafnium, vanadium, columbium, tantalum, chromium, molybdenum and tungsten), the rare-earth elements (lanthanum, cerium, praseodymium, neodymium, promethium, samarium, europium, gadolinium, terbium, dysprosium, holmium, erbium, thulium, ytterbium, and lutetium), the actinide series (actinium, thorium, protactinium, uranium, neptunium, plutonium, americium, curium, berkelium, californium, einsteinium, fermium, mendelevium, nobelium, and lawrencium), iron, cobalt, nickel and boron. Some of these metals require a high powered vaporization unit, such as an electron gun, in order to evaporate the same. In industrial production, electron gun vaporization would be preferred.

Wear resistant and corrosion resistant cutting edges are obtained with superhard materials which can be added to the ion implanted substrate surface. The hardest known materials are carbides, borides, and nitrides which are compounds of transition elements with second period elements, for example TiC, ScN, VC, $Cr_4C_3$, and, TiB. Additionally, any metal included in the above list of ion plating materials, other than the metal already plated on the substrate, can be added to the ion implanted surface of the teeth. These materials can be added to the steel substrate of the teeth as compounds; however, they are very stable and difficult the evaporate. The best procedure is to ion plate the pure metal (Ti, Cr, B, Sc, etc.) onto the cutting edge, and then convert the metal to the respective carbide, boride or nitride.

Whether to use carbon, boron or nitrogen depends upon the substrate coating. For instance, carbon is the best material to react with titanium, boron with vanadium and nitrogen with scandium.

The carburizing, boriding, nitriding or metallizing must be accomplished in an oxygen free atmosphere, because an oxide of the metal coating on the substrate might be formed which would be more brittle than the carbide, boride or nitride of that metal.

Carburizing can occur in a number of ways: a gas containing carbon, such as any hydrocarbon, can be heated up with the coated coil 20 at a temperature ranging from 600°–900° C (usually above 800° C) whereby the carbon and the metal coating react to form a carbide, such as TiC, etc. Suitable carbonizing gases include methane, natural gas, propane, acetylene and benzene.

The coated teeth can also be carburized by any other suitable means such as by any conventional box, cyanide, or gas carburizing method. It can also be treated in a plasma formed by a nitrogen-propane mixture (or any other carburizing gas mixture including carbon evaporated from an arc).

Preferably after the coating metal (titanium or tungsten) has been deposited over about one cubic millimeter of the tooth tip area of teeth 12 to a thickness of about .001 inch, the ion plating is discontinued and the titanium or tungsten coating is converted to a carbide. This is accomplished by introducing a mixture of methane, hydrogen and argon or propane, hydrogen and argon into the chamber 22 immediately after the plating has been terminated. The hydrogen is only sufficient quantity to assure a reducing atmosphere.

Then the coil 20 of saw blade 10 is permitted to cool and is removed from the vacuum chamber 22. Each tooth 12 has a coating 16 of titanium carbide or tungsten carbide which extends along its cutting edge 13, from a position intermediate the tip 15 and gulley 17 to the tip 15, itself, and thence from tip 15 along the trailing edge 14 to terminate at a position intermediate the tip 15 and gulley 17. This is shown in FIG. 2.

As pointed out above the length of the coating 16 along cutting edge 13 is from about 0.060 to about 0.070 inch while the length along the trailing edge 14 is about 0.070 to about 0.150 inch.

The coating 16 overlaps the side areas on both sides of the cutting edge 13 and trailing edge 14. The overlap on the sides, however, is only about 0.001 to about 0.003 inch wide.

An important step in the present process is the impulse hardening of the coated teeth 12 which occurs after the coil 20 of blade 10 has cooled and air has been admitted to the chamber 22. The coil 20 is then removed from chamber 22 and is then fed along a linear path at the rate of from about 10 to about 12 teeth per second. In this path, the teeth 12 are successively presented to the high frequency magnetic flux of the inductor 31 of an impulse hardening machine, denoted generally by numeral 30. Such machines are known under the trademark IMPULSA H.

Such an impulse hardening machine 30 is also disclosed in U.S. Pat. No. 2,799,760. The machine 30 is provided with a coil or inductor 31 formed of a length of heavy electrical wire shaped to provide a pair of legs 32 (connected electrically to machine 30) which lead respectively to an upper loop 33 and a lower loop 34. Loops 33 and 34 are spaced from each other in parallel planes and are concentrically disposed on a vertical axis. The loops 33 and 34 are each approximately 360°, the ends of the loops 33 and 34 being joined by an intermediate portion 35.

Figure 4:
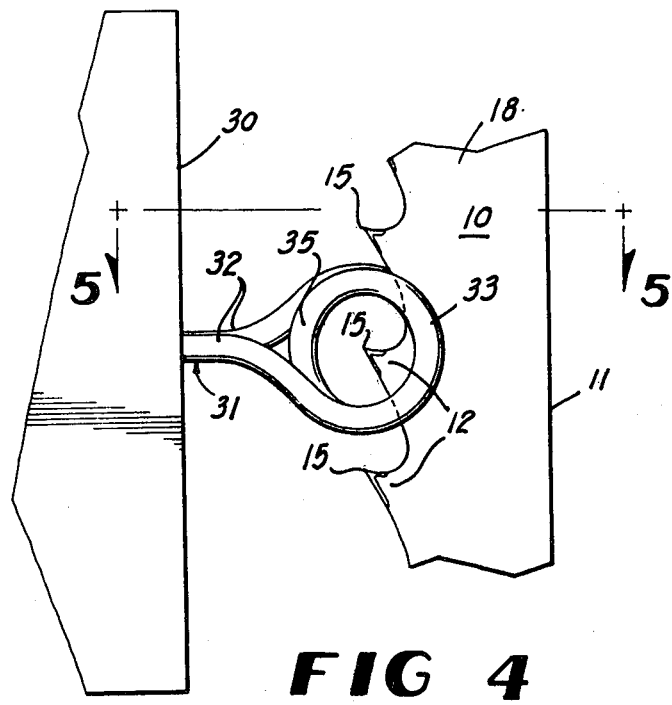
FIG. 4 is a side elevational view of a portion of band saw blade being passed through an impulse hardening coil of an impulse hardening machine.
Figure 5:
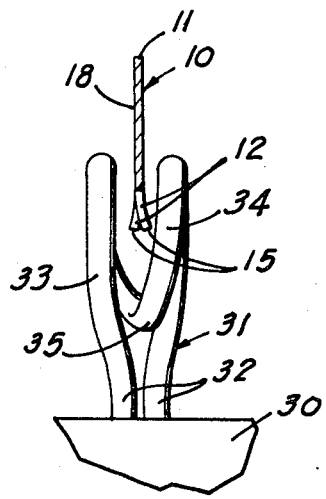
FIG. 5 is a plan view of the blade and coil and machine depicted in FIG. 4.

The blade 10 is passed along a path so that the tip 15 of each tooth 12 will pass to and be momentarily disposed at the axis of and between the loops 33 and 34. The loops 33, 34 also should be of large enough diameter that at least the outer half of each tooth 12 is momentarily within the locus of the inside diameters of loops 33 and 34, as shown in FIG. 4.

The machine 30 is arranged to provide pulses of 20 megacycles or more and is operated at about 6000 volts to provide induction heating of about 9 to 10 milliseconds duration. This provides pulsed square waves of more than 10 kilowatts per square centimeter for induction impulse hardening.

Normally a prehardened steel requires only a single pulse per tooth. A non pre-hardened steel becomes hardened by the first pulse and then acquires its fine grain by the second pulse.

The high frequency magnetic field of the inductor 31 unexpectedly causes a structural change in carbon implanted titanium as well as the underlying steel of tooth 12. If a pulse of short duration (1 to 20 milliseconds) is provided, only a relatively thin layer of steel, about one-tenth to about one-fifth of a millimeter in thickness, is heated. This area is heated to a temperature in the austenistic range, namely to a temperature of about 1000° to about 1200° C, and the heated area is immediately shocked down to low temperature by the thermal conductivity of the large unheated blade area. Thus, a martensitic microstructure of fine grains is produced, so fine that its structure cannot be resolved by optical microscopes. This clamps and firmly holds the titanium carbide layer which saturates, and is deeply imbedded by ion plating into, the steel.

The hardness of the coating 16 also appears to improve even though it is non-magnetic.

By such a procedure, the teeth are provided with a martensite portion which has a hardness of 1000 to 1350 HV and in some instances over 1400 HV on the Vickers scale. The coating (titanium carbide) has a hardness from 3000 to 4000 HV on the Vickers scale. In use even under corrosive conditions, such as when used for cutting meats and bone, a blade made according to the present invention will last 8 to 10 times as long as a conventional blade.

The last step in making the band saw blade is to cut the blade to length and weld the ends together to produce the continuous loop.

What is claimed is:

1. A process of producing a cutting tool providing a hardenable steel tool with a cutting edge comprising, ion implanting a coating of a second metal into said cutting edge, reacting said second metal with a chemical to make a compound which is harder than the second metal and subjecting both the cutting edge and its coating to a magnetic flux generated by electrical induction for impulse hardening the same.

2. The process defined in claim 1 wherein said second metal is selected from the group consisting of refractory metals and said chemical is carbon.

3. The process defined in claim 2 wherein said steel after hardening is martensitic.

4. The process defined in claim 3 wherein the surface of the resulting coating after hardening has a hardness in excess of 3,000 H.V. on the Vickers scale and said impulse hardened steel has a hardness in excess of 1000 H.V. on the Vickers scale.

5. The process defined in claim 3 wherein the steel before receiving the coating has been ion bombarded in a vacuum chamber with argon.

6. A cutting tool comprising a tool body having a cutting edge, a metal coating implanted into said cutting edge to the extent that a surface plate is obtained, the surface of said metal coating containing a chemical reacted with said coating, said chemical forming a compound with said refractory metal harder than the metal itself, said cutting edge into which the refractory metal is embedded having a martensitic grain structure adjacent said coating.

7. The cutting tool defined in claim 6 wherein said refractory metal is selected from the group consisting of scandium, titanium, yttrium, zirconium, hafnium, vanadium, columbium, tantalum, chromium, molybdenum, tungsten, lanthanum, cerium, praseodymium, neodymium, promethium, samarium, europium, gadolinium, terbium, dysprosium, holmium, erbium, thulium, ytterbium, lutetium, actinium, thorium, protactinium, uranium, neptunium, plutonium, americium, curium, berkelium, californium, einsteinium, fermium, mendelevium, nobelium, lawrencium, iron, cobalt, nickel, boron and alloys thereof.

8. The cutting tool defined in claim 6 wherein said martensitic grain structure is submicroscopic.

9. The cutting tool defined in claim 8 wherein said submicroscopic martensitic steel has a hardness in excess of about 1,000 H.V. on the Vickers scale and said coating is titanium carbide having a hardness of above 3,000 on the Vickers scale.

10. The cutting tool defined in claim 6 wherein said tool body is a saw blade, includes a plurality of spaced teeth, and said cutting edge is adjacent the tip of each tooth, said coating extending over the leading and trailing edge of each tooth.

11. The cutting tool defined in claim 10 wherein the surface of said coating is selected from the group consisting of tungsten carbide and titanium carbide.

12. The cutting tool defined in claim 10 wherein said coating extends from a position intermediate the gulley and tip of each tooth to said tip along both the cutting edge and trailing edge of each tooth.

13. The cutting tool defined in claim 11 wherein said submicroscopic steel has a hardness in excess of about 1000 H.V. on the Vickers scale and said surface of said coating has a hardness of above 3,000 on the Vickers scale.

* * * * *